US006534825B2

United States Patent
Calafut

(10) Patent No.: US 6,534,825 B2
(45) Date of Patent: Mar. 18, 2003

(54) POWER MOS DEVICE WITH IMPROVED GATE CHARGE PERFORMANCE

(75) Inventor: Daniel S. Calafut, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/219,603

(22) Filed: Aug. 14, 2002

(65) Prior Publication Data
US 2002/0190282 A1 Dec. 19, 2002

Related U.S. Application Data

(62) Division of application No. 09/468,269, filed on Dec. 20, 1999, now Pat. No. 6,461,918.

(51) Int. Cl.[7] .......................... H01L 29/76; H01L 29/94; H01L 31/062; H01L 31/113; H01L 31/119
(52) U.S. Cl. .................... 257/335; 257/337; 257/338; 257/340; 257/341
(58) Field of Search ............................... 257/335, 337, 257/338, 340, 341; 438/270, 271, 587, 593

(56) References Cited

U.S. PATENT DOCUMENTS

| | | |
|---|---|---|
| 4,324,038 A | 4/1982 | Chang et al. |
| 4,568,958 A | 2/1986 | Baliga |
| 4,673,962 A | 6/1987 | Chatterjee et al. |
| 4,745,079 A | 5/1988 | Pfiesler |
| 4,767,722 A | 8/1988 | Blanchard |
| 4,824,793 A | 4/1989 | Richardson et al. |
| 4,914,058 A | 4/1990 | Blanchard |
| 4,961,100 A | 10/1990 | Baliga et al. |
| 4,992,390 A | 2/1991 | Chang |
| 5,065,273 A | 11/1991 | Rajeevakumar |
| 5,134,448 A | 7/1992 | Johnsen et al. |
| 5,156,989 A | 10/1992 | Williams et al. |
| 5,168,331 A | 12/1992 | Yilmaz |
| 5,188,973 A | 2/1993 | Omura et al. |
| 5,208,657 A | 5/1993 | Chatterjee et al. |
| 5,242,845 A | 9/1993 | Baba et al. |
| 5,250,450 A | 10/1993 | Lee et al. |
| 5,275,961 A | 1/1994 | Smayling et al. |
| 5,281,548 A | 1/1994 | Prall |
| 5,300,452 A | 4/1994 | Chang et al. |
| 5,346,834 A | 9/1994 | Hisamoto et al. |
| 5,438,007 A | 8/1995 | Vinal et al. |
| 5,488,010 A | 1/1996 | Wong |
| 5,554,552 A | 9/1996 | Chi |
| 5,593,909 A | 1/1997 | Han et al. |
| 5,684,320 A | 11/1997 | Kawashima |
| 5,717,237 A | 2/1998 | Chi |
| 5,767,004 A | 6/1998 | Balasubramanian et al. |
| 5,894,157 A | 4/1999 | Han et al. |
| 5,977,591 A | 11/1999 | Fratin et al. |
| 6,051,488 A | 4/2000 | Lee et al. |
| 6,222,229 B1 | 4/2001 | Hebert et al. |

Primary Examiner—Olik Chaudhuri
Assistant Examiner—Shrinivas H. Rao
(74) Attorney, Agent, or Firm—Townsend and Townsend and Crew LLP

(57) ABSTRACT

A double-diffused metal-oxide-semiconductor ("DMOS") field-effect transistor with an improved gate structure. The gate structure includes a first portion of a first conductivity type for creating electron flow from the source to the drain when a charge is applied to the gate. The gate structure includes a second portion of a second conductivity type having a polarity that is opposite a polarity of the first conductivity type, for decreasing a capacitance charge under the gate. A second structure for decreasing a capacitance under the gate includes an implant region in the semiconductor substrate between a channel region, where the implant region is doped to have a conductivity opposite the channel region.

11 Claims, 8 Drawing Sheets

600

POWER MOS DEVICE WITH IMPROVED GATE CHARGE PERFORMANCE

CROSS-REFERENCES TO RELATED APPLICATIONS

This application is a divisional of and claims the benefit of U.S. patent application Ser. No. 09/468,269 filed Dec. 20, 1999, now U.S. Pat. No. 6,461,918 this application is herein incorporated by reference for all purposes.

BACKGROUND OF THE INVENTION

The present invention relates to field-effect transistors, in particular double-diffused metal-oxide-semiconductor ("DMOS") transistors, and their method of manufacture.

A DMOS transistor is a type of field-effect transistor ("FET") that can be used as a power transistor, that is, a transistor that is used to switch or control relatively large amounts of electrical power compared to a transistor that might be used in a logic circuit application. Power transistors might operate between 1–1000 volts, or higher, and might carry from several tenths of an amp to several amps of current, or higher. Power MOSFETs are designed to operate under conditions that would destroy conventional MOSFETs, or accelerate their failure.

Design of DMOS transistors presents challenges over other conventional MOS transistor devices, in particular relating to the structure of the channel and drain regions. FIGS. 1 and 2 illustrate a conventional trench DMOS transistor 100 and planar DMOS transistor 200, respectively. FIG. 1 shows a semiconductor substrate 102 with a trench 110 formed to a predetermined depth into the substrate. At the bottom of the substrate is an n+ drain region 120. Above the drain is an epitaxial layer 125 doped to a lighter degree of the same conductivity as the drain region. Overlying the epitaxial region is a channel region 105 implanted with a dopant having a polarity that is opposite the substrate and epitaxial regions. As illustrated in FIG. 1, the dopant profile ranges from a lesser degree to a greater degree away from the trench, to where a concentration of dopant forms a body region.

Formed near the surface of the substrate on either side of the trench are source regions 130, implanted with a dopant of the same conductivity type as the drain. Source and drain regions of the transistor shown in FIG. 1 are illustrated as n+, the channel region as p−, and a body region as p+. It should be readily apparent to a person skilled in the art that the polarity of the conductivity type for the transistor structure could be reversed. A dielectric layer 112 lines the trench. Filling the trench over the dielectric layer is a gate 114, which is typically made of polysilicon material doped to a similar conductivity type as the source and drain regions.

In operation, a charge applied to the gate creates a channel for electron migration across a channel 132 alongside the trench between the sources 130 and the epitaxial region 125, and flowing to the drain 120. The charge applied to the gate also forms an accumulation area 134 in the epitaxial layer under the trench, where electrons accumulate.

FIG. 2 illustrates a conventional planar DMOS transistor 200 fabricated on a semiconductor substrate 202. An n+ drain region lies at the bottom of the substrate. Overlying the drain is an n− epitaxial layer 225. Source regions 230 are formed of an implant of n+ dopants into an area just below the top surface of the substrate. Surrounding each source region underneath are P-type channel regions 205, which form a channel 232 between the source and the epitaxial layer. At least partially overlying each source region is a dielectric layer 212. Coextensively overlying the dielectric layer is a polysilicon gate 214 implanted with dopants of the same conductivity type as the source regions.

A charge applied to the gate causes electrons to flow from the sources, across the channels to the epitaxial region, and then down to the drain. Because of the uniform charge on the gate, an accumulation of electrons forms at the surface in the epitaxial layer just below the gate, between the channel regions, in an accumulation area 234.

An important design issue for both trench and planar DMOS transistors is the gate charge required to drive the gate of the MOSFET to a specific voltage. FIG. 3 illustrates an ideal gate charge curve for a conventional DMOS transistor. In a particular range, denoted as the Miller Q range, additional charge on the gate is insufficient to overcome certain parasitic capacitance that arise during operation. Several important ones of the parasitic capacitance are labeled in FIGS. 1 and 2. A capacitance between the gate and the source, $C_{gs}$, forms in the area where the gate overlaps the source. A gate-to-drain capacitance, $C_{gd}$, forms between the gate and the accumulation region, where electrons accumulate as a current path is formed from the channel region to the drain.

The capacitance $C_{gd}$ is also known as the "Miller capacitance." The Miller capacitance is an effective build-up of capacitative charge which must be overcome in order to bias the transistor to a particular voltage, as shown in FIG. 3. Increasing the gate charge has adverse effects. Transistor switching speed is significantly reduced where a larger gate charge is required. Further, the failure rate of transistors subject to higher gate charge is increased. Thus, it is desired to minimize the Miller capacitance over a range of charge, so as to reduce the gate charge and enhance transistor switching speed, efficiency, and improve failure rates.

One method of reducing the Miller capacitance is shown in U.S. Pat. No. 5,879,994, which describes a process and structure to apply a non-uniform gate dielectric layer, where a thicker oxide is applied over the accumulation area, and a thinner oxide is formed over the inversion channel area. The extra-thick oxide, or "terrace oxide" over the region where the Miller capacitance occurs, has some limitations. First, for planar DMOS transistors, alignment of the terrace oxide is difficult to achieve, and adds significantly to the costs of manufacturing the devices. Being easily misaligned, transistors formed with a terrace oxide have substantially lower yields. The difficulty with which to build a nonuniform dielectric layer exists in trench DMOS structures as well.

An alternative approach for reducing the Miller capacitance begins by considering voltage-dependent capacitance characteristics of MOS devices under various gate bias conditions. FIG. 4 shows a well-known CV curve for a conventional MOS device. At the extremes of the applied gate voltage $|V_g|$, the capacitance value maintains a constant value that depends only on the thickness of the dielectric (assumed to be $SiO_2$, although not limited herein as such). This is due to a layer of mobile charge, at the extreme points on the curve, which causes the interface between the dielectric and the silicon substrate to effectively become a second plate of a capacitor.

As the gate voltage approaches a value known as the "flat band" voltage, as viewed from the accumulation side, the capacitance begins to decrease until a point called the "threshold" voltage is reached. This point is reached when the mobile charge distribution near the $SiO_2$—Si interface transitions from accumulation to inversion. Beyond the threshold voltage $V_t$, the area immediately around the $SiO_2$—Si interface is said to be inverted and there is again a layer of mobile charge, albeit of opposite polarity. In this range the MOS capacitance is limited by the gate oxide thickness.

Close to the threshold $V_t$, there is a point $C_{min}$ that represents the lowest value of capacitance for a given gate bias voltage in conventional MOS devices. However, a novel DMOS structure could be made so as to shift Cmin to as near the $V_{gs}$ value range for the Miller region shown in FIG. 3. This would lower the capacitance within the Miller range, and effectively decrease the range of charge needed to overcome the Miller capacitance.

SUMMARY OF THE INVENTION

The present invention provides a method of fabricating a gate structure of a DMOS device. The fabrication method includes the steps of forming a polysilicon gate on a portion of a semiconductor substrate, implanting a dopant of a first conductivity type into the polysilicon gate, masking the polysilicon gate to define an alternation region within the gate, and implanting a dopant of a second conductivity type into the alternation region, where the second conductivity type has an electrical polarity opposite a polarity of the first conductivity type.

In another embodiment, the present invention provides a gate of a semiconductor device that includes a polysilicon gate structure overlying a channel region in a semiconductor substrate and extending at least partially over a source formed in the substrate adjacent the channel region. The polysilicon gate structure has a first portion being of a first conductivity type and a second portion being of a second conductivity type defining an alternation region. The second conductivity type has a polarity that is opposite a polarity of the first conductivity type.

In yet another embodiment, the present invention provides a method of fabricating a gate structure of a trench-type DMOS device. The method includes the steps of forming a trench in a semiconductor substrate, lining the trench with a dielectric layer, and forming a first polysilicon gate portion to an intermediate depth of the trench. The method further includes the steps of implanting a dopant of a first conductivity type into the first gate portion, forming a second polysilicon gate portion in the trench over the first gate structure to a level substantially equal to a top surface of the silicon substrate, and implanting a dopant of a second conductivity type into the second gate portion.

In still yet another embodiment, the present invention provides a composite gate structure in a trench transistor. The composite gate structure includes a trench extending a selected depth from a top surface of a semiconductor substrate, a conformal dielectric layer lining the trench, a first gate portion disposed over the dielectric layer and extending from the bottom to an intermediate depth of the trench, the first gate portion having a first conductivity type, and a second gate portion disposed over the first gate portion and the dielectric layer, and extending from the intermediate depth to the top surface, the second gate portion having a second conductivity type that is of an opposite polarity from the first conductivity type.

In still yet another embodiment, the present invention provides a semiconductor device having a channel region of a first conductivity type formed by diffusing a dopant of the first conductivity type into a substrate having a second conductivity type, a gate dielectric disposed on the substrate, and an implant region of a second conductivity type formed by diffusing a dopant of the second conductivity type under the gate dielectric, the second conductivity type having a polarity opposite a polarity of the first conductivity type.

DESCRIPTION OF THE SPECIFIC EMBODIMENTS

The present invention provides a composite gate structure and methods of manufacture. The composite gate structure lowers gate to drain overlap capacitance and enhances switching speed and efficiency.

Figure 5:
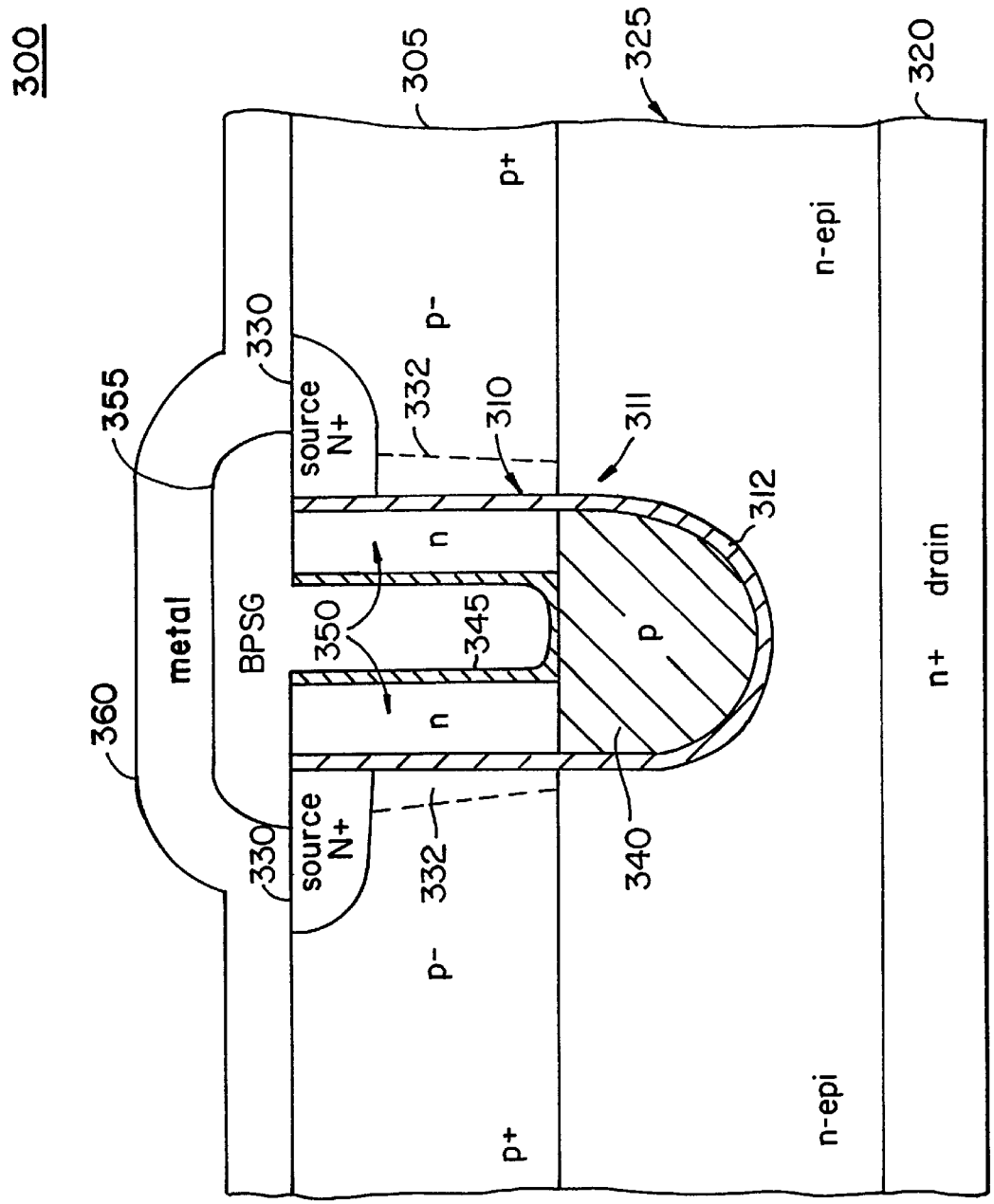
FIG. 5 is a simplified cross section of a trench DMOS transistor according to the present invention.

FIG. 5 is a simplified cross section of a trench DMOS transistor 300 according to an embodiment of the present invention. This example illustrates a n– channel device, however, it is understood that the invention could be applied to an p– channel device. The DMOS transistor is fabricated on an n+ silicon substrate 320 that serves as the drain of the DMOS transistor. An n– epitaxial layer 325 is grown on the substrate. A p– channel region 332 and a p+ body region 305 is formed over the n– epitaxial layer, which is considered part of the "substrate" for purposes of this description. The p– channel region and p+ body region are formed by implanting and diffusing dopants of a p-type conductivity.

A trench 310 is formed into the substrate to a predetermined depth, extending into the n– epitaxial layer. N+ source regions are implanted and diffused into both the p+ body region and the p– channel region, as well as adjacent to opposing sides of the trench at the top surface of the substrate. A gate oxide 312 is deposited over the walls of the trench, and a composite gate structure 311 fills the trench over the gate oxide.

According to the present invention, the gate structure is initially formed of a first portion 340, deposited into the trench, preferably from the bottom of the trench to a depth substantially corresponding to a depth of the n– epitaxial layer. According to one embodiment of the invention, the first portion is a polysilicon grown in the trench, and a p-type dopant is implanted directly into the trench into the polysilicon. The first portion is doped with a sufficient amount of implant to minimize the capacitance in the accumulation area for a certain predetermined voltage, such as 1 volt.

A second portion 350 of the gate structure is grown on top of the first portion. As illustrated in FIG. 5, the second portion is preferably etched in the middle down to the first portion. A conformal polycide layer 345 is then deposited over sides of the second portions and the top of the first portion. The polycide layer acts to short out the second portion, which would otherwise be floating, or basically cuts the portion in half to divide it into two isolated cells. An insulator 355 is then formed over the polycide layer in the trench, as well as over the top of the trench and at least partially extending over the source regions on the surface of the substrate. In a preferred embodiment, the insulator is boro-phospho silicon glass (BPSG), but also may be any material exhibiting generally nonconductive properties, such as silicon dioxide ($SiO_2$). A metal layer 360 is formed on the top of the substrate and over the insulator, to provide electrical contact to the source regions.

Figure 6:
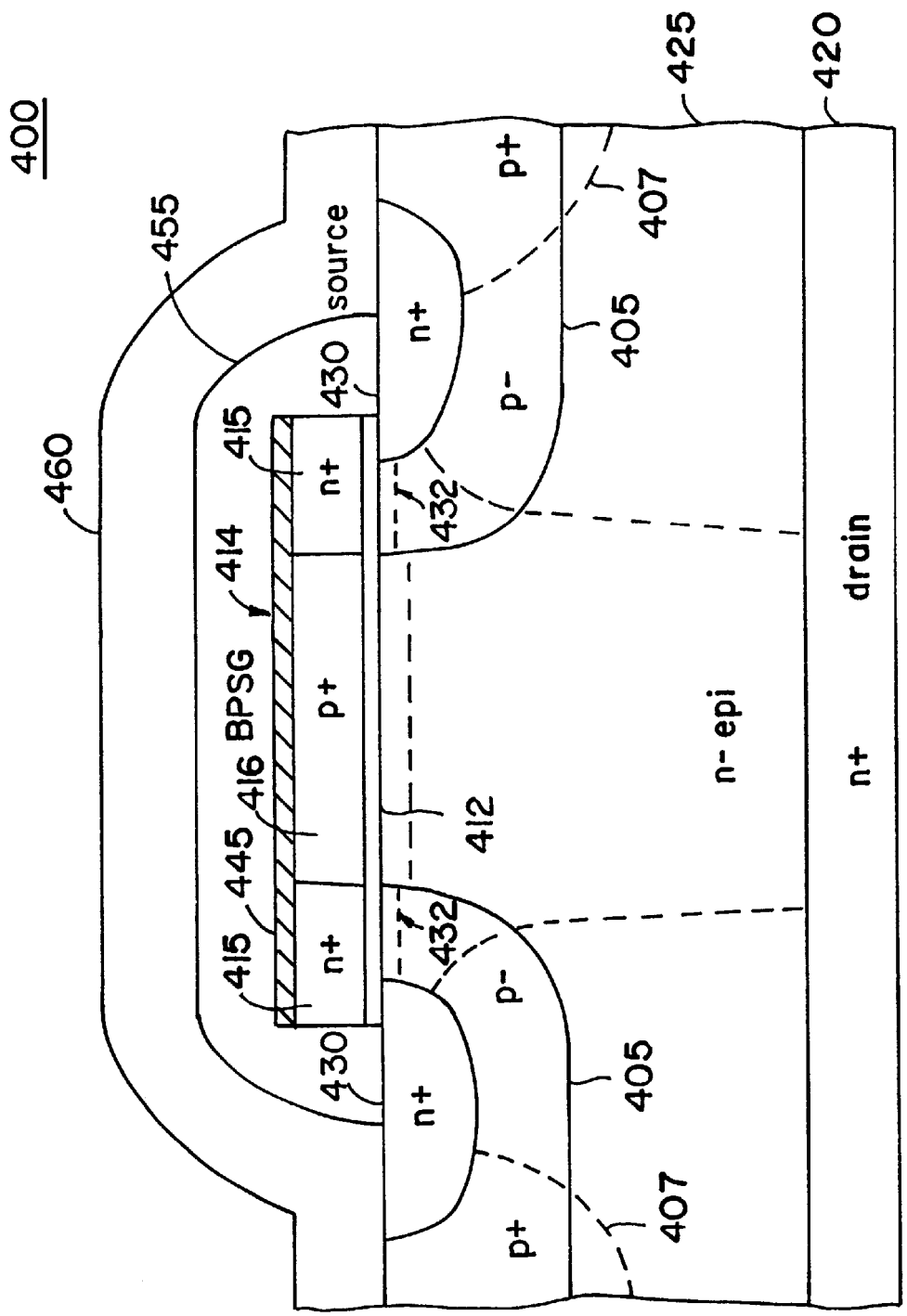
FIG. 6 is a simplified cross section of a planar DMOS transistor according to the present invention.

FIG. 6 is a simplified cross section of a planar DMOS transistor 400 according to an embodiment of the present invention. The DMOS transistor is illustrated in FIG. 6 to show the composite gate structure in an n-channel transistor, but it is understood the invention could equally be applied to a p-channel transistor by reversing most of the polarities of the portions of the transistor.

An n+ region 420 serves as the drain of the planar DMOS transistor, just as in the trench case. An n− epitaxial layer 425 is grown on the n+ region. A p− channel region 405 and a p+ body region 407 are formed in the substrate in the epitaxial layer, and defining an accumulation area in the epitaxial layer therebetween. The channel and body regions are doped according to a predetermined doping profile that need not be further explained here. N+ source regions 430 are implanted and diffused into each of both the channel region and body region, as well as laterally under a gate structure 414. A gate oxide 412 is grown over the p-channel regions and the accumulation area.

The gate structure is formed over the gate oxide, preferably of a deposited and etched polysilicon layer. In a preferred embodiment, the polysilicon gate structure is implanted with a dopant of a first conductivity type to yield a polarity of n+. The gate structure is then masked, and a dopant of a second conductivity type, having a polarity that is opposite to the polarity of the first conductivity type, such as p+, for example, is implanted into the masked area. The p+ implanted material is then driven by diffusion to extend over an area with edges that substantially correspond to the extent of the accumulation area in the substrate.

The gate structure is then overlaid with an insulator 455, as discussed above. A metal layer 460 is then formed over the insulator and extended to the source regions 430, to provide electrical contact to the source regions. In operation, a charge applied to the gate will cause the greatest current flow between the sources through the channels, while charge in the accumulation area is repelled by the opposing polarity of the second conductivity type formed above it. In this way, the capacitative charge built up in the accumulation area is minimized within a given range of current.

In exemplary preferred embodiments of either the trench or planar DMOS structures, the n-type portion of the gate structure is formed by implanting ions of either arsenic or phosphorous into the polysilicon. The p-type portion of the gate structure is preferably formed by implanting ions of boron into the polysilicon. It should be understood, however, that other dopants may be implanted into the gate structure of the present invention to produce the desired conductivity profile, as described above with reference to FIGS. 5 and 6.

Figure 7:
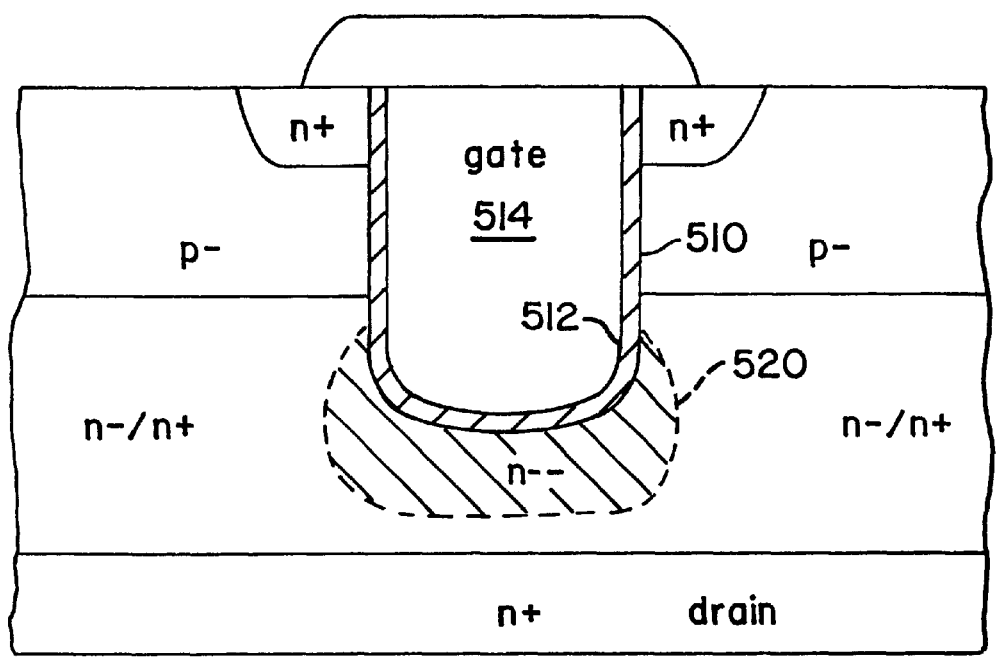
FIG. 7 is a simplified cross section of a trench DMOS transistor according to an alternative embodiment of the invention.
Figure 8:
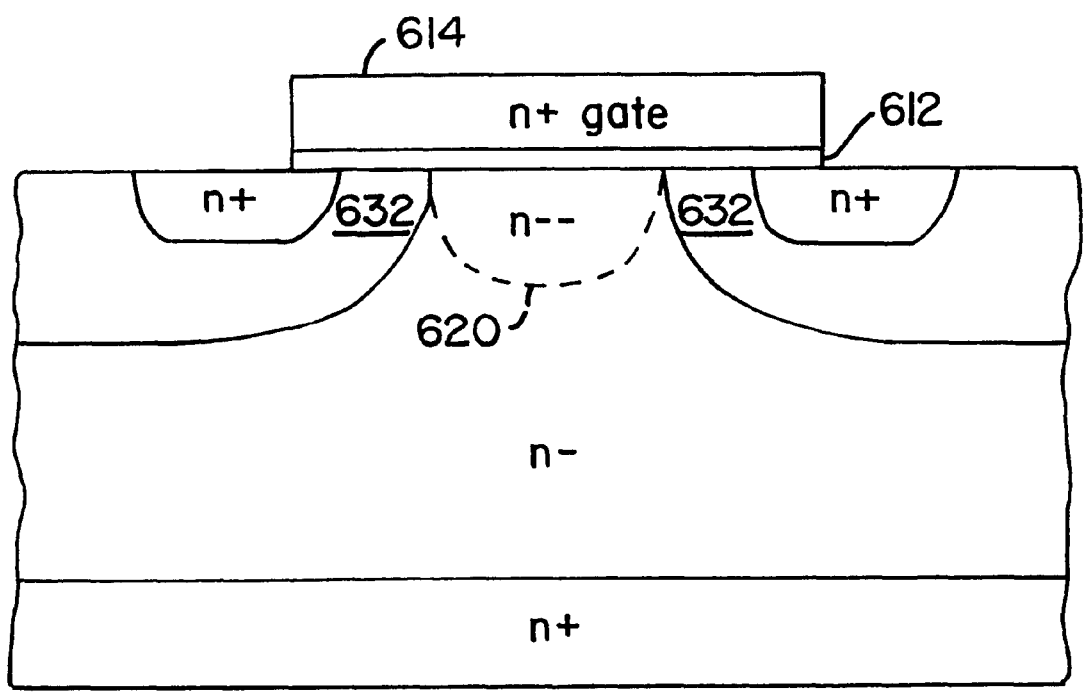
FIG. 8 is a simplified cross section of a planar DMOS transistor according to an alternative embodiment of the invention.

The present invention mitigates a build up of charge in the accumulation area proximate the gate structure of a DMOS transistor cell. In an alternative embodiment, as illustrated in FIGS. 7 and 8, the present invention provides an implant region into the epitaxial layer just underneath the gate between channel regions of two transistor cells. The alternative embodiment of the invention is adaptable to both the trench and planar configurations.

Figure 1:
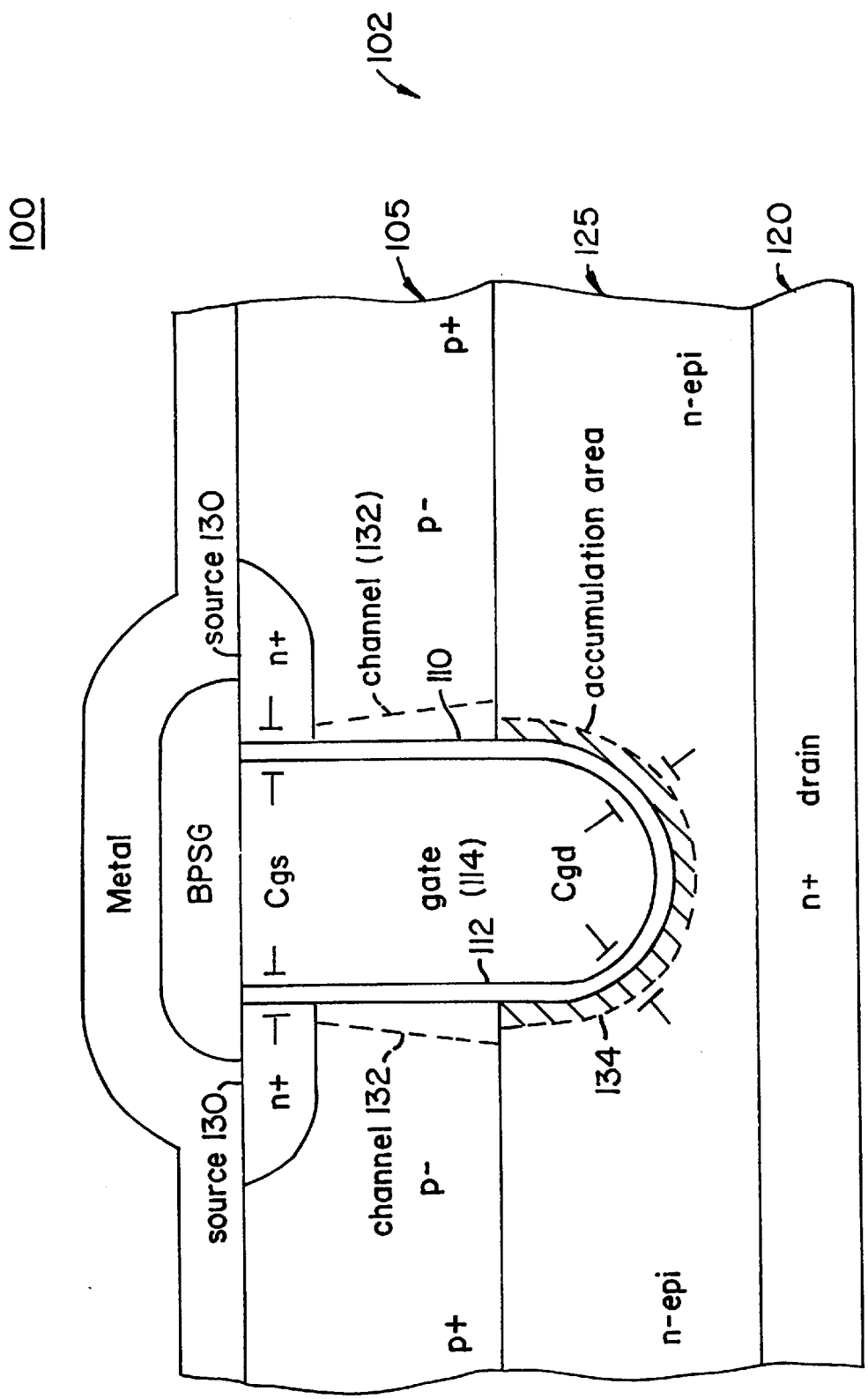
FIG. 1 is a simplified cross section of a conventional trench DMOS transistor.
Figure 2:
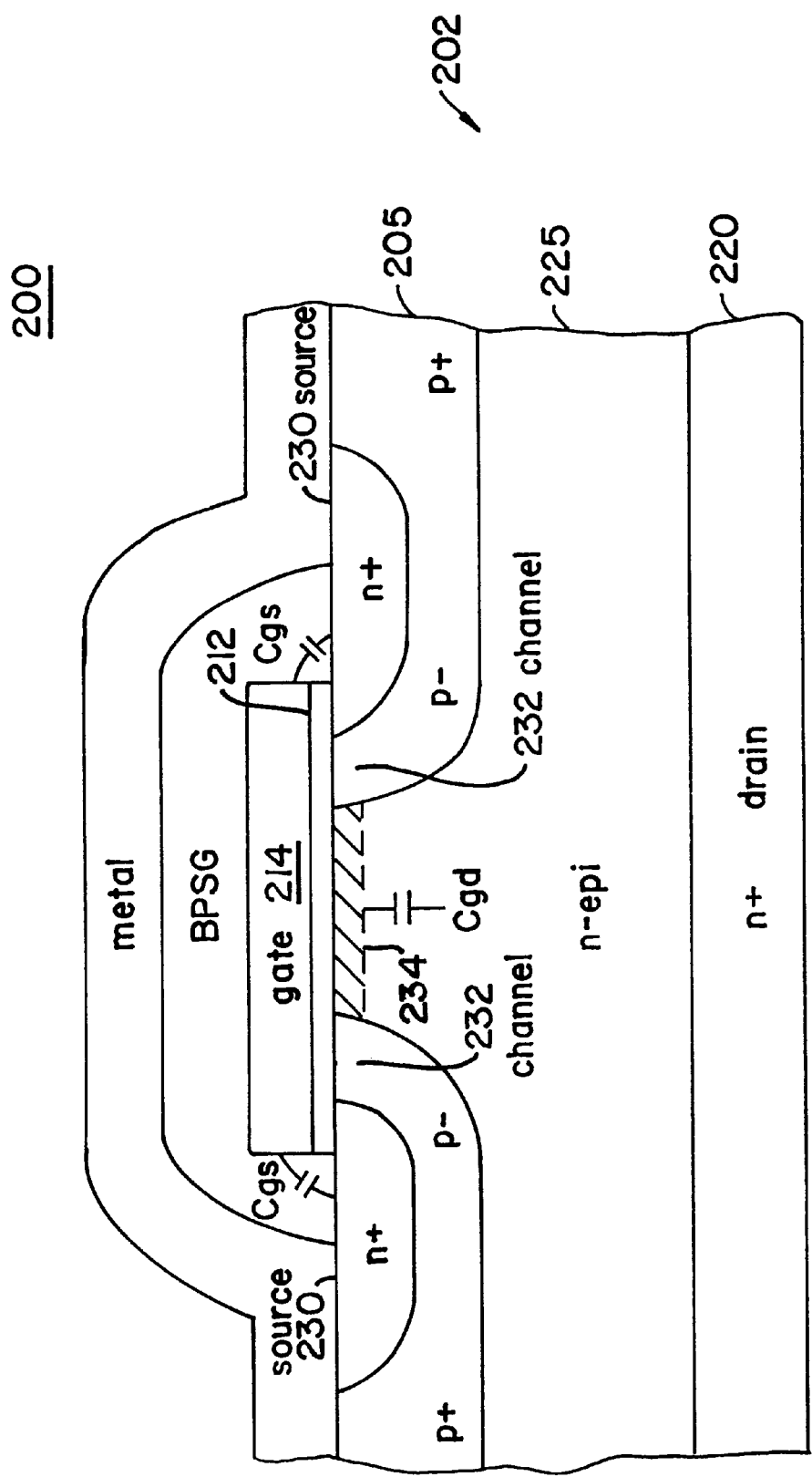
FIG. 2 is a simplified cross section of a conventional planar DMOS transistor.
Figure 3:
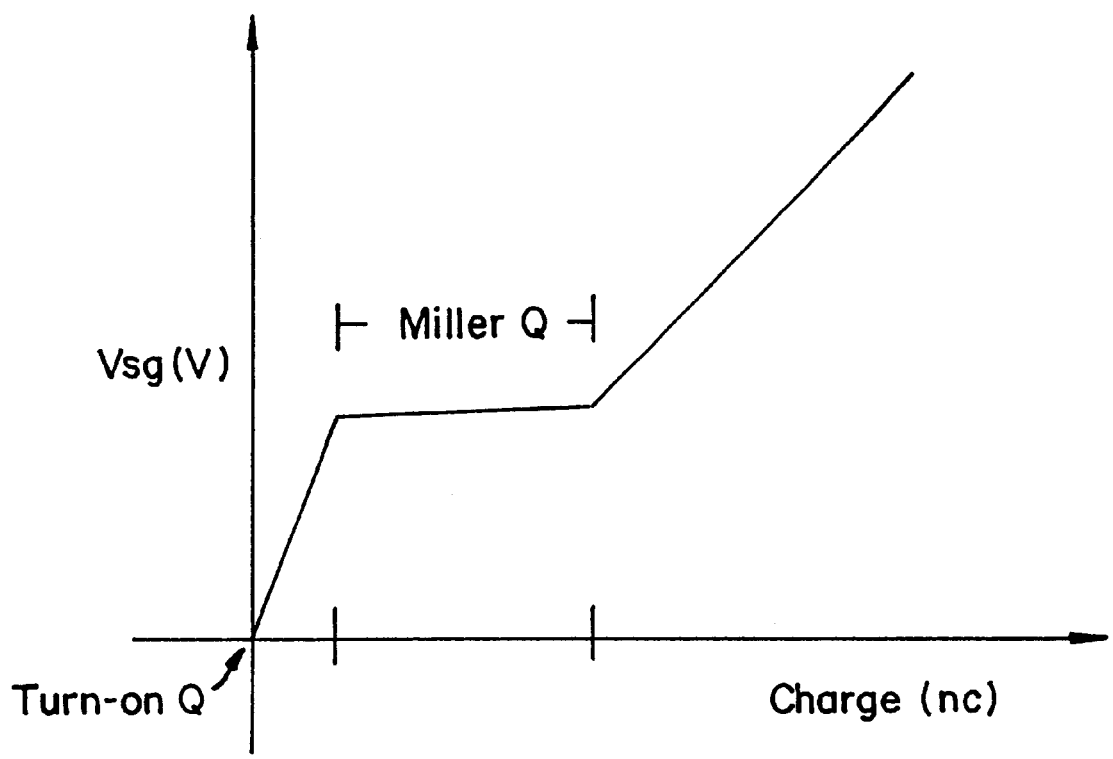
FIG. 3 shows a gate charge-gate voltage (QV) curve for conventional MOS devices.
Figure 4:
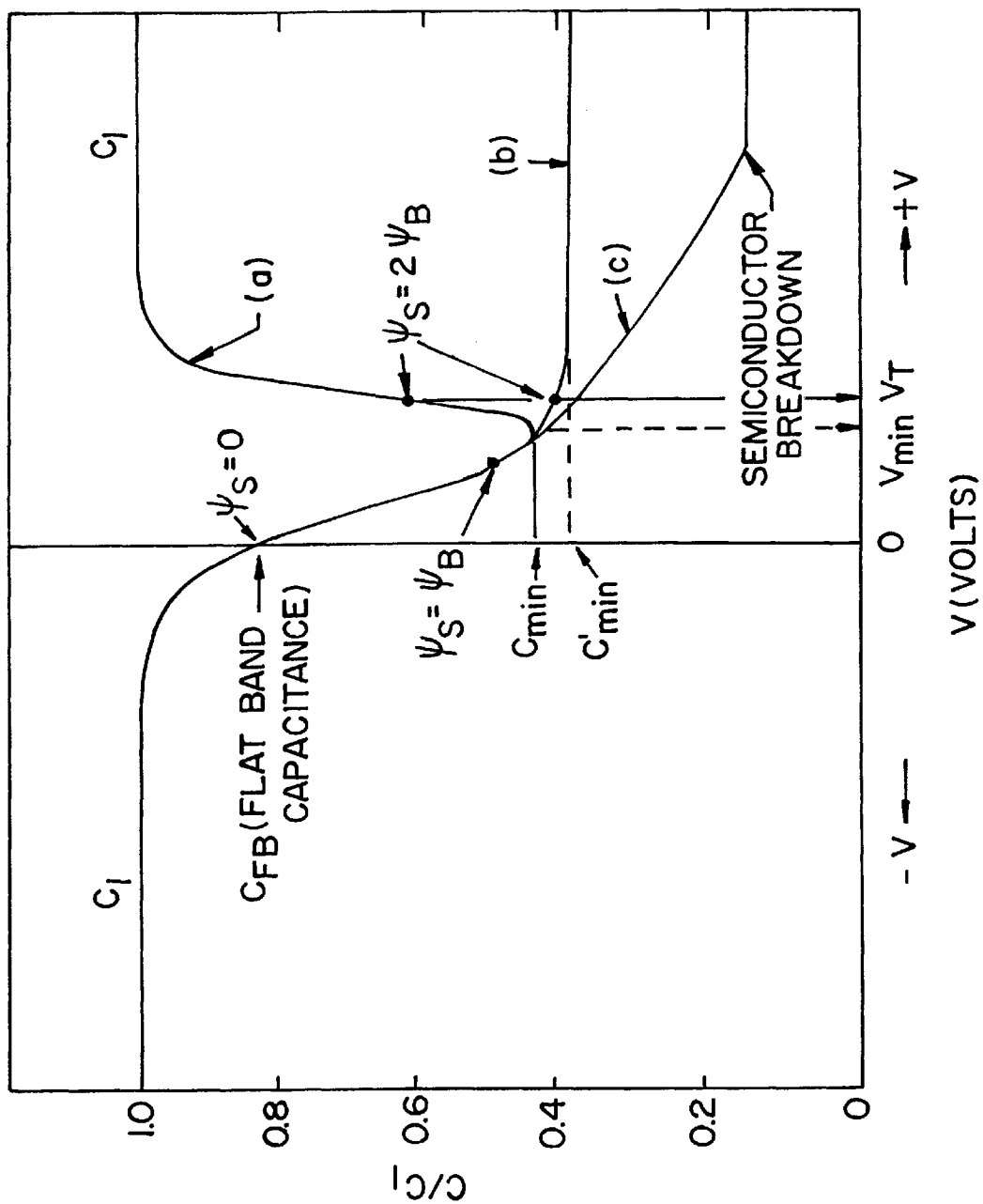
FIG. 4 is a capacitance-voltage curve (CV) for conventional MOS devices.

With reference to FIG. 7, there is illustrated a simplified cross section of a trench DMOS transistor 500, showing only the improved structure of the present invention. The DMOS transistor includes a trench 510 formed into a semiconductor substrate as described above in detail. At the bottom of the trench, in the area of the epitaxial layer where the accumulation area is formed, as shown in FIG. 1, an implant area 520 is formed as a lightly doped region. The implant area has a cross-sectional profile that surrounds the bottom of the trench at least within the n− epitaxial layer.

The implant area may be formed in one of several ways. Once the trench is formed, n-type ions may be implanted directly into the bottom of the trench, in a zero-angle ion implant step. Once implanted, the device is subjected to a drive step to diffuse the n-type ions out from the trench into the epitaxial layer. The drive step is preferably accomplished by annealing the transistor, then driving it at approximately 900–1500 degrees F., to diffuse the ion atoms. The resultant implant area preferably exhibits a Gaussian profile concentration, with the heaviest concentration of n-type ion. Or, the drive step can include multiple implant steps, until a desired implant profile is achieved.

FIG. 8 illustrates an implant area 620 in a planar DMOS transistor 600, to counteract the adverse effects of the Miller capacitance near a gate structure 614 of the transistor. The implant area is formed by an ion implant of n-type atoms into the accumulation area, between channel regions 632 underlying the n+ source regions. The implant area is preferably formed by masking an area of the semiconductor substrate surface, after p-type implant to form the channels. Then, the n-type material is implanted into the masked area. Next, the implant is driven to a desired profile, preferably extending to each channel region. The n-type material should have a higher density at the surface of the substrate. After the implant area is formed, the gate structure may be formed by employing conventional fabrication techniques.

While the above is a complete description of specific embodiments of the present invention, various modifications, variations, and alternatives may be employed. For example, although a silicon is given as an example of a substrate material, other materials may be used. The invention is illustrated for a two-transistor cell DMOS FET, but it could be applied to other DMOS structures, such as a multi-cell array of DMOS transistors on a single substrate. Similarly, implantation is given as an example of providing dopants to the substrate, but other doping methods, such as a gas or topical dopant source may be used to provide dopants for diffusion, depending on the appropriate mask being used. These and other alternatives may appear to those skilled in the art; hence, the scope of this invention should not be limited to the embodiments described, but are instead defined by the following claims.

What is claimed is:

1. A double-diffused metal oxide semiconductor (DMOS) device comprising;
    a body region of a first conductivity type in a semiconductor substrate having a drain region of a second conductivity type;
    a source region of the second conductivity type in the body region a trench formed in the semiconductor substrate;

a dielectric layer lining the trench;

a first polysilicon gate portion formed to an intermediate depth of the trench;

a dopant of the first conductivity type implanted into the first polysilicon gate portion;

a second polysilicon gate portion in the trench formed over the first polysilicon gate portion to a level substantially equal to a top surface of the silicon substrate, wherein the second polysilicon gate portion is formed by etching an intermediate portion of said second polysilicon gate portion down to the first polysilicon gate portion to form Opposite side walls;

a dopant of the second conductivity type implanted into the second polysilicon gate portion; and a polycide strap layer formed over the first polysilicon gate portion, in the intermediate portion, and on the opposite side walls of the second polysilicon gate portion.

2. The DMOS device of claim 1 further comprising a conductive material on the polycide strap layer and being at a level substantially equal to the top surface of the silicon substrate.

3. The DMOS device of claim 1 wherein the first conductivity type is p-type and the second conductivity type is u-type.

4. The DMOS device of claim 1, further comprising,
an insulator over the polycide strap layer, in the trench and Over the top of the trench.

5. The DMOS device of claim 4 wherein the insulator extends over the source region.

6. The DMOS device of claim 4 further comprising:
a metal layer formed over the insulator.

7. The DMOS device of claim 1 wherein the source region is formed after the trench is formed.

8. The DMOS device of claim 1 further comprising an insulator over the polycide strap layer, in the trench and Over the lop of the trench, and wherein the insulator comprises borophosphosilicon glass (BPSG).

9. The DMOS device of claim 1 wherein the first polysilicon gate portion further includes the dopant of the first conductivity type implanted therein in an amount sufficient to minimize the capacitance in an accumulation area for a predetermined voltage.

10. The DMOS device of claim 1 further comprising an insulator over the polycide strap layer, in the trench and over the top of the trench, and a metal layer over the insulator to provide electrical contact to die source region.

11. The DMOS device of claim 1 wherein the DMOS device is a power MOS device.

* * * * *

UNITED STATES PATENT AND TRADEMARK OFFICE
CERTIFICATE OF CORRECTION

PATENT NO. : 6,534,825 B2
DATED : March 18, 2003
INVENTOR(S) : Daniel S. Calafut It is certified that error appears in the above-identified patent and that said Letters Patent is hereby corrected as shown below:

Column 6,
Line 61, after "comprising" delete ";" and insert -- : --.
Line 67, after "region", insert -- ; --.

Column 7,
Line 14, replace "Opposite" with -- opposite --.
Line 27, replace "u-type" with -- n-type --.

Column 8,
Lines 3 and 13, replace "Over" with -- over --.
Line 13, replace "lop" with -- top --.

Signed and Sealed this

Fifteenth Day of July, 2003

JAMES E. ROGAN
*Director of the United States Patent and Trademark Office*